(12) United States Patent
Marakhtanov et al.

(10) Patent No.: US 10,249,476 B2
(45) Date of Patent: *Apr. 2, 2019

(54) CONTROL OF IMPEDANCE OF RF RETURN PATH

(71) Applicant: Lam Research Corporation, Fremont, CA (US)

(72) Inventors: Alexei Marakhtanov, Albany, CA (US); Rajinder Dhindsa, San Jose, CA (US); Ken Lucchesi, Newark, CA (US); Luc Albarede, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 118 days.

This patent is subject to a terminal disclaimer.

(21) Appl. No.: 15/133,049

(22) Filed: Apr. 19, 2016

(65) Prior Publication Data

US 2016/0233058 A1 Aug. 11, 2016

Related U.S. Application Data

(63) Continuation of application No. 14/043,525, filed on Oct. 1, 2013, now Pat. No. 9,337,000.

(51) Int. Cl.
*H01J 37/32* (2006.01)
(52) U.S. Cl.
CPC .............................. *H01J 37/32183* (2013.01)
(58) Field of Classification Search
None
See application file for complete search history.

(56) References Cited

U.S. PATENT DOCUMENTS

| | | |
|---|---|---|
| 5,195,045 A | 3/1993 | Keane et al. |
| 6,703,080 B2 | 3/2004 | Reyzelman et al. |
| 6,750,614 B2 | 6/2004 | Nakano et al. |
| 6,871,111 B2 | 3/2005 | Nakano et al. |
| 7,342,361 B2 | 3/2008 | Ellingboe |
| 8,262,847 B2 | 9/2012 | Dhindsa et al. |
| 8,932,429 B2 | 1/2015 | Chen et al. |
| 8,980,044 B2 | 3/2015 | Brillhart et al. |
| 9,059,678 B2 | 6/2015 | Long et al. |
| 9,111,722 B2 | 8/2015 | Dorf et al. |

(Continued)

FOREIGN PATENT DOCUMENTS

JP 2002316040 A 10/2002

*Primary Examiner* — Douglas W Owens
*Assistant Examiner* — Srinivas Sathiraju
(74) *Attorney, Agent, or Firm* — Penilla IP, APC

(57) ABSTRACT

A system for controlling an impedance of a radio frequency (RF) return path includes a matchbox further including a match circuitry. The system further includes an RF generator coupled to the matchbox to supply an RF supply signal to the matchbox via a first portion of an RF supply path. The RF generator is coupled to the matchbox to receive an RF return signal via a first portion of an RF return path. The system also includes a switch circuit and a plasma reactor coupled to the switch circuit via a second portion of the RF return path. The plasma reactor is coupled to the match circuitry via a second portion of the RF supply path. The system includes a controller coupled to the switch circuit, the controller configured to control the switch circuit based on a tune recipe to change an impedance of the RF return path.

20 Claims, 14 Drawing Sheets

(56) References Cited

U.S. PATENT DOCUMENTS

| | | |
|---|---|---|
| 9,119,283 B2 | 8/2015 | Albarede |
| 9,287,086 B2 | 3/2016 | Brouk et al. |
| 9,320,126 B2* | 4/2016 | Valcore, Jr. .............. H05H 1/46 |
| 9,337,000 B2* | 5/2016 | Marakhtanov .... H01J 37/32183 |
| 9,401,264 B2* | 7/2016 | Marakhtanov .... H01J 37/32183 |
| 9,406,485 B1 | 8/2016 | Cheng et al. |
| 9,502,216 B2 | 11/2016 | Valcore, Jr. et al. |
| 9,584,090 B2 | 2/2017 | Mavretic |
| 9,620,334 B2* | 4/2017 | Lyndaker .......... H01J 37/32183 |
| 9,673,026 B2* | 6/2017 | Valcore, Jr. ....... H01J 37/32165 |
| 9,684,327 B2* | 6/2017 | Fritsch ...................... G05F 3/00 |
| 2005/0264218 A1 | 12/2005 | Dhindsa et al. |
| 2006/0088655 A1* | 4/2006 | Collins ................... C23C 14/48 427/8 |
| 2010/0136793 A1* | 6/2010 | Chen ................ H01J 37/32082 438/710 |
| 2011/0128017 A1 | 6/2011 | Booth et al. |
| 2011/0148303 A1 | 6/2011 | Van Zyl et al. |
| 2012/0097332 A1* | 4/2012 | Lin ................... H01J 37/32532 156/345.54 |
| 2012/0168081 A1 | 7/2012 | Son |
| 2012/0318456 A1 | 12/2012 | Brouk et al. |
| 2012/0319584 A1 | 12/2012 | Brouk et al. |
| 2013/0023064 A1 | 1/2013 | Marakhtanov et al. |
| 2013/0059448 A1 | 3/2013 | Marakhtanov et al. |
| 2013/0126475 A1 | 5/2013 | Dhindsa et al. |
| 2013/0127124 A1* | 5/2013 | Nam ................ H01J 37/32577 279/128 |
| 2013/0127476 A1* | 5/2013 | Marakhtanov .... H01J 37/32532 324/615 |
| 2013/0128409 A1* | 5/2013 | Nam ................... H01L 21/6831 361/234 |
| 2013/0327481 A1 | 12/2013 | Marakhtanov et al. |
| 2014/0172335 A1* | 6/2014 | Valcore, Jr. .............. H05H 1/46 702/65 |
| 2014/0195033 A1* | 7/2014 | Lyndaker .......... H01J 37/32183 700/121 |
| 2014/0231389 A1* | 8/2014 | Nagami ............ H01J 37/32091 216/67 |
| 2015/0091440 A1* | 4/2015 | Marakhtanov .... H01J 37/32532 315/111.21 |
| 2015/0091441 A1* | 4/2015 | Marakhtanov .... H01J 37/32183 315/111.21 |
| 2016/0260584 A1* | 9/2016 | Marakhtanov .... H01J 37/32183 |
| 2016/0307738 A1* | 10/2016 | Marakhtanov .... H01J 37/32183 |
| 2018/0151331 A1 | 5/2018 | Liu et al. |

* cited by examiner

CONTROL OF IMPEDANCE OF RF RETURN PATH

CLAIM OF PRIORITY

The present patent application is a continuation of and claims the benefit of and priority, under 35 U.S.C. 120, to a patent application having application Ser. No. 14/043,525, filed on Oct. 1, 2013, and titled "CONTROL OF IMPEDANCE OF RF RETURN PATH", which is incorporated by reference herein in its entirety.

CROSS-REFERENCE TO RELATED APPLICATIONS

The present patent application is related to a patent application having application Ser. No. 14/043,574, filed on Oct. 1, 2013, and titled "CONTROL OF IMPEDANCE OF RF DELIVERY PATH", which is incorporated by reference herein in its entirety.

FIELD

The present embodiments relate to controlling an impedance of a radio frequency (RF) return path.

BACKGROUND

Plasma-based systems include a supply source that is used to generate a signal. The plasma-based systems further include a chamber, which receives the signal to generate plasma. The plasma is used for a variety of operations including cleaning a wafer, depositing oxides and thin films on the wafer, and etching away a portion of the wafer or a portion of the oxides and the thin films.

Some properties of plasma, such as standing waves in plasma, etc., are difficult to control in order to be able to control uniformity of plasma etching or depositing. The difficulty in controlling plasma properties results in a non-uniformity in etching of material of the wafer or in deposition of material on the wafer. For example, the wafer is etched more at a first distance from its center than at a second distance away from the center. The second distance is further away from the center than the first distance. As another example, the wafer is etched less at the first distance than at the second distance. As yet another example, a higher amount of material is deposited on the wafer at the first distance compared to that deposited at the second distance. As another example, a higher amount of material is deposited on the wafer at the second distance compared to that deposited at the first distance. The non-uniformity in etching results in an M-shaped etch or a W-shaped etch of a wafer. The non-uniformity in etching or depositing results in a reduced wafer yield.

It is in this context that embodiments described in the present disclosure arise.

SUMMARY

Embodiments of the disclosure provide apparatus, methods and computer programs for controlling an impedance of a radio frequency (RF) return path. It should be appreciated that the present embodiments can be implemented in numerous ways, e.g., a process, an apparatus, a system, a piece of hardware, or a method on a computer-readable medium. Several embodiments are described below.

In some embodiments, uniformity is achieved by controlling an impedance of an RF return path in a plasma tool. The impedance is controlled by controlling a capacitance and/or an inductance between an impedance match circuitry of the plasma tool and a plasma reactor of the plasma tool. When the impedance is controlled, the uniformity is achieved.

In various embodiments, a system for controlling an impedance of a radio frequency (RF) return path is described. The system includes a matchbox further including a match circuitry. The system further includes an RF generator coupled to the matchbox to supply an RF supply signal to the matchbox via a first portion of an RF supply path. The RF generator is coupled to the matchbox to receive an RF return signal via a first portion of an RF return path. The system also includes a switch circuit and a plasma reactor coupled to the switch circuit via a second portion of the RF return path. The plasma reactor is coupled to the match circuitry via a second portion of the RF supply path. The system includes a controller coupled to the switch circuit, the controller configured to control the switch circuit based on a tune recipe to change an impedance of the RF return path.

In various embodiments, a system includes an RF transmission line further including an RF rod and a grounded RF tunnel. The system includes a plasma reactor and an impedance match circuitry coupled via the RF transmission line to the plasma reactor. The RF transmission line is used for supplying an RF supply signal to the plasma reactor via the RF rod and for receiving an RF return signal from the plasma reactor via the grounded RF tunnel. The system includes a switch circuit coupled between the impedance match circuitry and the plasma reactor for controlling an impedance of the RF return signal.

In several embodiments, a method includes receiving an RF return signal from a plasma reactor via an RF return path portion of an RF transmission line. The method further includes modifying an impedance of an RF return path including the RF return path portion to achieve a measurable factor and sending the modified RF return signal via an RF cable sheath to an RF generator.

Some advantages of some of the above-described embodiments include a control of uniformity in etch rates or deposition rates applied to a substrate. For example, an impedance of an RF return path is controlled by a switch circuit to achieve the uniformity. A capacitance, an inductance, or a combination thereof, of the switch circuit is changed to control the impedance of the RF return path. The RF return path is formed between a gap of a plasma chamber and an RF generator that is used to generate an RF signal. The control in uniformity reduces non-uniformity in the etch rates or in the deposition rates.

Additional advantages of some of the above-described embodiments include controlling an impedance of an RF return path of a plasma system to achieve a pre-determined uniformity in etch rates or in deposition rates. The pre-determined uniformity is stored within a tune recipe. Moreover, a one-to-one correspondence between the uniformity and an inductance, a capacitance, or a combination thereof of a switch circuit is stored in the tune recipe. A processor is programmed to achieve uniformity within the tune recipe. The processor retrieves an inductance, a capacitance, or a combination thereof that corresponds to a measurable factor, e.g., an etch rate, or a deposition rate, or a uniformity in etch rates, or a uniformity in deposition rates, or a combination thereof, etc., from the tune recipe and sends one or more signals to corresponding one or more switches of the switch circuit. The one or more switches are opened or closed by the signals to change an inductance, a capacitance, or a combination thereof, of the switch circuit to achieve the corresponding inductance, the corresponding capacitance, or a combination thereof of the tune recipe. The change in the inductance, the capacitance, or a combination thereof, of the switch circuit allows the processor to achieve uniformity in etch rates of etching a substrate or in deposition rates of depositing materials on the substrate.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

DETAILED DESCRIPTION

The following embodiments describe systems and methods for controlling an impedance of a radio frequency (RF) return path. It will be apparent that the present embodiments may be practiced without some or all of these specific details. In other instances, well known process operations have not been described in detail in order not to unnecessarily obscure the present embodiments.

Figure 1:
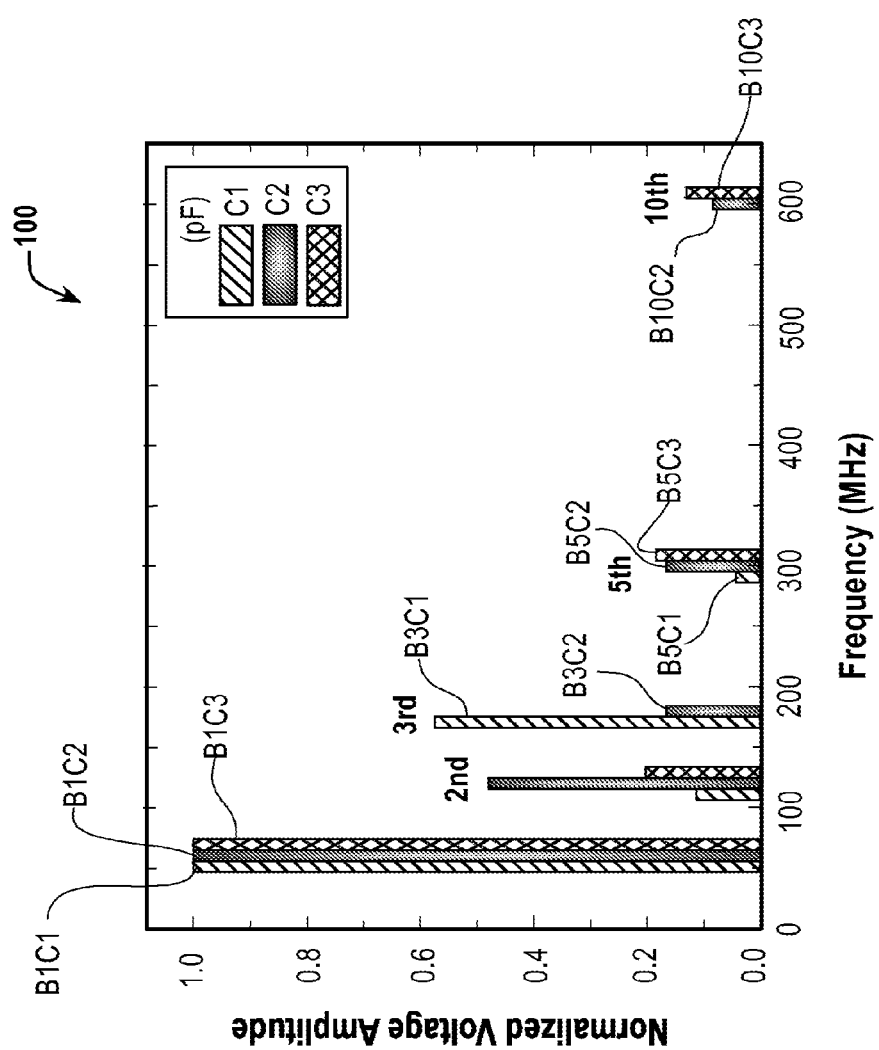
FIG. 1 is a graph that is used to illustrate a non-uniformity in a normalized voltage at a high order harmonic of a 60 MHz signal, in accordance with one embodiment described in the present disclosure.

FIG. 1 is an embodiment of a graph 100 that is used to illustrate a non-uniformity in a normalized voltage at a high order harmonic of a 60 MHz signal. The high order harmonic creates a standing wave voltage in plasma and the standing wave voltage results in a non-uniformity in etching a substrate or depositing materials on the substrate.

In various embodiments, the high order harmonic is a harmonic of a third order or higher. In some embodiments, the high order harmonic is a harmonic of a second order or higher.

The graph 100 plots a normalized voltage amplitude, of an RF signal, measured at an input of an upper electrode of a plasma chamber versus frequency of the RF signal. In several embodiments, a voltage is measured at the input of the upper electrode and is normalized to generate the normalized voltage.

As shown in the graph 100, at a third order harmonic of the RF signal, there is non-uniformity in voltage that is measured at the input of the upper electrode for three different capacitance values of a filter that is coupled to the input of the upper electrode are used. For example, a bar B3C1 corresponds to a capacitance value C1 of the filter and a bar B3C2 corresponds to a capacitance value C2 of the filter.

In some embodiments, an output of the upper electrode is at a bottom surface of the upper electrode. The top surface is located opposite to a bottom surface of the upper electrode and is at the input of the upper electrode. The bottom surface of the upper electrode faces a gap within the plasma chamber. The gap is formed between the upper electrode and a chuck, e.g., an electrostatic chuck (ESC), etc. The chuck is located within the plasma chamber and includes a lower electrode that faces the upper electrode. The chuck is disposed on a facility plate that is located below the lower electrode.

Moreover, as shown in the graph 100, at a fifth order harmonic and at a tenth order harmonic of the RF signal, there is non-uniformity in voltage measured at the upper electrode. For example, a bar B5C1 corresponds to the capacitance value C1, a bar B5C2 corresponds to the capacitance value C2, and a bar B5C3 corresponds to a capacitance value C3 of the filter. As another example, at the tenth order harmonic, a bar B10C2 corresponds to the capacitance value C2 and a bar B10C3 corresponds to the capacitance value C3.

Also, shown in the graph 100 is a bar B1C1 that corresponds to the capacitance value C1, a bar B1C2 that corresponds to the capacitance value C2, and a bar B1C3 that corresponds to the capacitance value C3.

Furthermore, a table 1 provided below illustrates a decrease in a standing wavelength λ in plasma with an increase in frequency of the RF signal.

TABLE 1

| Frequency (MHz) | Standing Wavelength (centimeters) | Standing Quarter Wavelength (centimeters) (pattern radius on a substrate) |
|---|---|---|
| 60 | 113 | 28 |
| 120 | 43 | 11 |
| 180 | 24 | 6 |
| 240 | 16 | 4 |
| 300 | 12 | 3 |
| 360 | 9 | 2.3 |
| 420 | 7 | 1.8 |
| 480 | 6 | 1.5 |
| 600 | 3.5 | 0.87 |

It should be noted that in various embodiments, the table 1 is generated for a gap, within the plasma chamber, between the upper and lower electrodes and a voltage of the RF signal.

In some embodiments, the standing wavelength in plasma is determined as a function of an applied RF voltage, a frequency of the RF signal and the gap. The function is illustrated using an equation:

$$\lambda/\lambda_0 \approx 40 V_0^{1/10} l^{-1/2} f^{-2/5} \quad (1)$$

where $V_0$ is the applied RF voltage, $l$ is a length of the gap, $\lambda_0$ is a standing wavelength measured in vacuum, and $f$ is a frequency of the RF signal. The length $l$ of the gap is a distance between the lower electrode and the upper electrode. The applied RF voltage is applied to an electrode of the plasma chamber.

The decrease in the standing wavelength λ with the increase in a harmonic frequency of the RF signal results in non-uniformity in etch rates or deposition rates. The non-uniformity in etch rates include non-uniformities in rates of etching a substrate, e.g., a wafer, or a wafer on which integrated circuits are fabricated, etc., in the plasma chamber. Moreover, the non-uniformities in deposition rates include non-uniformities in rates of depositing materials on the substrate. The non-uniformity in the etch rates is illustrated below in FIG. 3.

Figure 2:
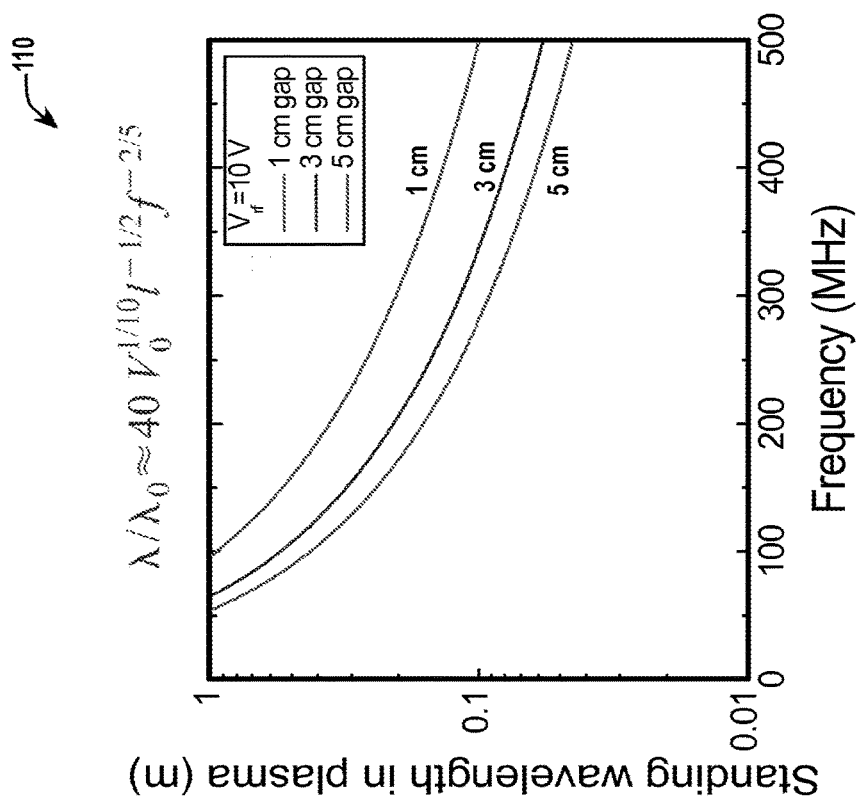
FIG. 2 is a graph to illustrate a change in a standing wavelength λ in plasma with a change in a frequency of a radio frequency (RF) signal and with a change in a gap, in accordance with one embodiment described in the present disclosure.

FIG. 2 is an embodiment of a graph 110 to illustrate a change in the standing wavelength λ in plasma with a change in a frequency of the RF signal and/or with a change in the gap between the upper and lower electrodes. The graph 110 plots the standing wavelength λ versus the frequency of the RF signal. The frequency of the RF signal is plotted in megahertz (MHz) and the standing wavelength is plotted in meters (m) in the graph 110. As shown in the graph 110, for each gap of 1 cm, 3 cm, and 5 cm, there is a decrease in the standing wavelength λ with an increase in a frequency of the RF signal.

Figure 3:
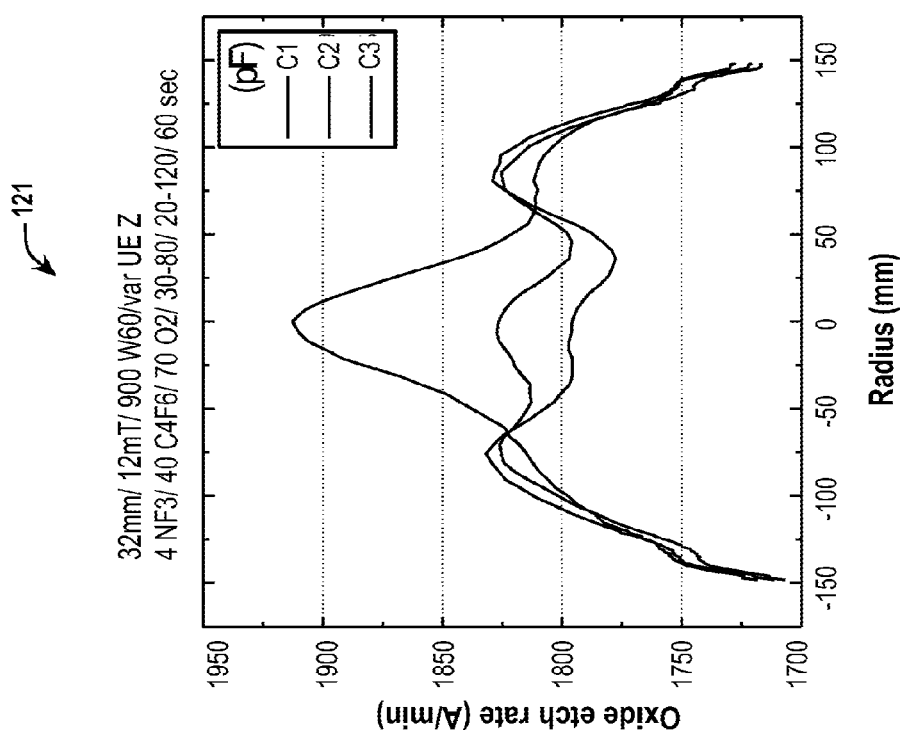
FIG. 3 is a graph for illustrating a change in non-uniformity in etch rates with an increase in a capacitance value of a filter that is connected to an input of an upper electrode and with an increase in a harmonic of an RF signal, in accordance with one embodiment described in the present disclosure.

FIG. 3 is an embodiment of a graph 121 for illustrating a non-uniformity in etch rates with a change in a distance along a radius of the substrate. The graph 121 plots an etch rate, measured in Angstroms per minute (A/min) versus a radius of the substrate for the three different capacitance values C1 thru C3. The radius of the substrate is measured in millimeters (mm).

It is noted that a curve that corresponds to the capacitance value C1 in the graph 121 is created as a result of a third harmonic of the RF signal. The curves that correspond to the capacitance values C2 and C3 in the graph 121 are created as a result of a second harmonic of the RF signal. The curves that correspond to the capacitance values C2 and C3 in the graph 121 have a higher amount of uniformity compared to the curve that corresponds to the capacitance value C1 in the graph 121.

It should be noted that the graph 121 is generated for a process condition, which includes a value of the gap, or a pressure within the plasma chamber, or a combination of one or more process gases supplied to the plasma chamber, or a time for which the process gases are supplied, or an identity of an RF generator that is on, or a combination thereof, etc. The RF generator is on when the RF generated is powered on and is supplying power.

Examples of the RF generator include an x MHz RF generator, a y MHz RF generator, and a z MHz RF generator. Examples of x, y, and z include 2, 27, and 60. It should be noted that a frequency of operation of an RF generator is not limiting and encompasses other frequencies that are within a pre-determined operating range of the frequency. For example, although a generator is referred to herein as a 2 MHz RF generator, the generator operates between 1 and 3 MHz. As another example, although a generator is referred to herein as a 27 MHz RF generator, the generator operates between 25 and 29 MHz. As yet another example, although a generator is referred to herein as a 60 MHz RF generator, the generator operates between 57 and 63 MHz.

Figure 4A:
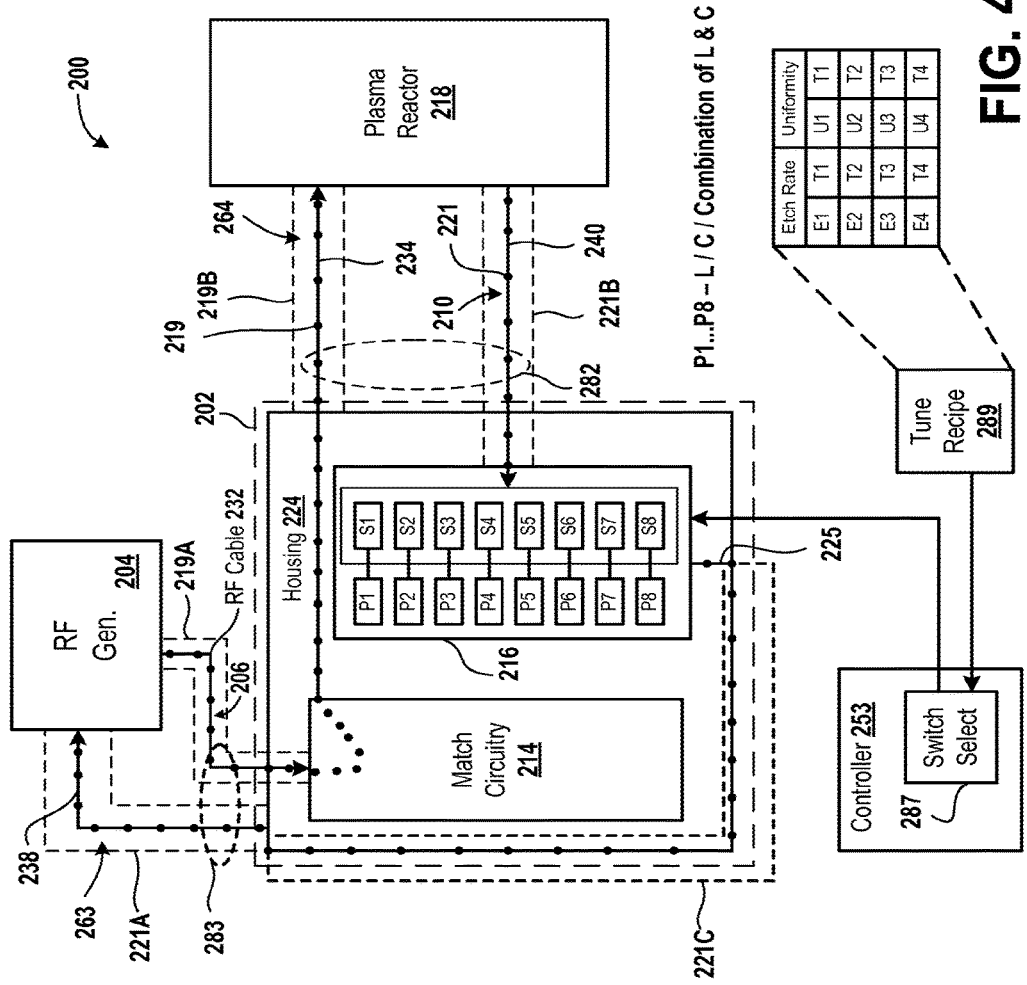
FIG. 4A is a diagram of a system for controlling an impedance of an RF return path to control non-uniformity in etch rates or deposition rates, in accordance with one embodiment described in the present disclosure.

FIG. 4A is a diagram of an embodiment of a system 200 for controlling an impedance of an RF return path of the system 200. The system 200 includes an RF generator 204, an RF cable system 283, a matchbox 202, an RF transmission line 282, a plasma reactor 218, and a controller 253. The RF cable system 283 couples the RF generator 204 to the matchbox 202 and the RF transmission line 282 couples the matchbox 202 to the plasma reactor 218.

A controller, as used herein, includes a processor and a memory device. As used herein, a processor refers to a central processing unit, or a microprocessor, or an application specific integrated circuit, or a digital signal processor, or a programmable logic device. Examples of a memory device include a random access memory (RAM) and a read-only memory (ROM). In some embodiments, a memory device is a flash memory, or a hard disk, or a redundant array of storage disks (RAID), or a combination thereof.

Examples of the RF generator 204 include the x, y, or z MHz RF generator. In some embodiments, any number of RF generators, e.g., the x MHz RF generator, the y MHz RF generator, and/or the z MHz RF generator, etc., are coupled to the matchbox 202.

The RF cable system 283 includes an RF cable 232 and an RF cable sheath 238. The RF cable sheath 238 surrounds the RF cable 232 to protect the RF cable 232. In some embodiments, an RF cable and an RF cable sheath, as referred to herein, is made of a conductor, e.g., a metal, etc. Examples of a metal include copper, or aluminum, or a combination thereof, etc. In some embodiments, the RF cable sheath 238 encloses the RF cable 232. The RF cable system 283 is coupled to the RF generator 204 and the matchbox 202.

Similarly, the RF transmission line 282 includes an RF rod 234 and an RF tunnel 240. The RF tunnel 240 surrounds the RF rod 234. In various embodiments, the RF tunnel 240 is made of a metal, surrounds and encloses the RF rod 234, and is separated from the RF rod 234 by an insulator material. The RF transmission line 282 is coupled to the matchbox 202 and to the plasma reactor 218. In some embodiments, the RF tunnel 240 is grounded, e.g., coupled to a ground potential, or coupled to a reference potential, or coupled to a zero potential, etc.

In some embodiments, a reference voltage is a non-zero voltage. In various embodiments, an insulator surrounds the RF rod 234 and the RF tunnel 240 encloses the insulator. The insulator is located between the RF rod 234 and the RF tunnel 240.

It should be noted that in some embodiments, each of the RF cable 232, the RF cable sheath 238, the RF rod 234, and the RF tunnel 240 has a cross-section of any shape, e.g., circular, polygonal, square, etc.

The matchbox 202 includes a housing 224. In some embodiments, the housing 224 encloses and surrounds a match circuitry 214 to protect the match circuitry 214. Moreover, the housing 224 encloses and surrounds a switch circuit 216 of the matchbox 202 to protect the switch circuit 216. In some embodiments, the switch circuit 216 is accessed from within the housing 224 after opening connection mechanisms, e.g., screws, bolts, etc., that are used to form walls of the housing 224. The match circuitry 214 is coupled to the RF cable 232 and to the RF rod 234. Moreover, the switch circuit 216 is coupled to the RF tunnel 240 and to the housing 224 via a connection 225, which in some embodiments, includes one or more RF straps, or one or more RF rods, or a combination of one or more RF straps and one or more RF rods.

The match circuitry 214 includes a combination of circuit elements, e.g., resistors, or capacitors, or inductors, or a combination thereof, etc., to match an impedance of a source with that of a load. The source supplies an RF signal to the match circuitry 214 and the load consumes an RF signal that is supplied by the match circuitry 214. The RF signal that is received from the source by the match circuitry 214 is combined by the match circuitry 214 to generate an RF signal that is supplied via the RF rod 234 to the plasma reactor 218.

Examples of the source include one or more of the x, y, and z MHz RF generators and one or more of RF cable systems that couple the RF generators to the match circuitry 214, and any other circuits coupled between the RF generator and the match circuitry 214. Examples of the load include the RF transmission line 282 and the plasma reactor 218, and any other circuitry, e.g., the switch circuit 216, etc., coupled between the plasma reactor 218 and the match circuitry 214.

The RF generator 204 generates an RF signal 206 that is supplied, e.g., delivered, etc., via the RF cable 232 to the match circuitry 214. For example, a driver and amplifier system of the RF generator 204 generates the RF signal 206. The match circuitry 214 combines the RF signal 206 with one or more RF signals that are received from one or more other RF generators to generate an RF supply signal 264, which is supplied to the plasma reactor 218 via the RF rod 234. In various embodiments, the match circuitry 214 combines the RF signal 206 with one or more RF signals received from one or more of the other RF generators to match an impedance of the source with that of the load. In some embodiments, the RF signals 264 and 210 are generated when the impedance of the source matches with that of the load.

A plasma chamber of the plasma reactor 218 is provided with a process gas, e.g., an oxygen-containing gas, or oxygen, or a fluorine-containing gas, or tetrafluoromethane ($CF_4$), or sulfur hexafluoride ($SF_6$), or hexafluoroethane ($C_2F_6$), or a combination thereof, etc. The RF supply signal 264 ignites the process gas to generate plasma within the plasma chamber.

The plasma generates a return RF signal 210, which is reflected from the plasma reactor 218 towards the RF generator 204. The return RF signal 210 is transferred via the RF tunnel 240 to the switch circuit 216.

The switch circuit 216 controls, e.g., modifies, etc., an impedance of the RF return signal 210 to generate an RF return signal 263. For example, the switch circuit 216 changes a capacitance, or an inductance, or a combination thereof, of the RF return signal 210. As another example, one or more of switches S1 thru S8 of the switch circuit 216 are closed and the remaining of the switches S1 thru S8 are open to modify an impedance of the RF return signal 210.

When a switch of the switch circuit 216 is closed, a parametric element (P), e.g., an inductor, a capacitor, or a combination thereof, etc., is coupled via the switch to the RF tunnel 240 and modifies an impedance of the RF return signal 210. For example, when a switch of the switch circuit 216 is closed, an impedance of a parametric element coupled to the switch is added to or subtracted from an impedance of the RF return signal 210 received from the plasma reactor 218. Moreover, when the switch of the switch circuit 216 is closed, the parametric element is coupled via the connection 225 to a portion of the housing 224, which is grounded. On the other hand, when the switch of the switch circuit 216 is open, the parameter element coupled to the switch is decoupled from the RF tunnel 240.

The RF return signal 263 is transferred via the connection 225 and a grounded portion, of the housing 224, connected to the connection 225, and via the RF cable sheath 238 to the RF generator 204. For example, the RF return signal 263 is reflected towards the RF driver and amplifier system of the RF generator 204 via the RF cable sheath 238.

In some embodiments, an RF supply path 219 includes a first portion 219A, circuit elements of the match circuitry 214, a second portion 219B, and a connection between the RF rod 234 and an RF rod of the plasma reactor 218. The RF supply path 219 is indicated by dots traveling from the RF generator 204 to the plasma reactor 218 in FIG. 4A. The first portion 219A of the RF supply path includes the RF cable 232 and the second portion 219B includes the RF rod 234. The RF rod of the plasma reactor 218 is coupled to the lower electrode of the chuck. Examples of the circuit elements of the match circuitry 214 include inductors, or capacitors, a conductor coupling an inductor with another inductor or capacitor, or a combination thereof.

In various embodiments, at least a portion of an RF return path 221 is grounded, e.g., coupled to a ground voltage, or coupled to a reference voltage, or coupled to a zero voltage, etc. The RF return path 221 includes a first portion 221A and a second portion 221B. The RF return path 221 lies along dots traveling from the plasma reactor 214 to the RF generator 204 in FIG. 4A. The first portion 221A of the RF return path includes the RF cable sheath 238 and the second portion 221B of the RF return path includes the RF tunnel 240.

In some embodiments, the RF return path 221 includes a C-shroud of the plasma chamber, a ground ring of the plasma reactor 218, RF straps of the plasma reactor 218, a bottom electrode housing of the plasma reactor 218, a ground shield of the plasma reactor 218, the second portion 221B, the switch circuit 216, the connection 225, a grounded portion 221C of the housing 224 connecting the connection 225 with the first portion 221A, and the first portion 221A.

In various embodiments, the controller 253 is coupled to the switch circuit 216. The controller 253 includes a switch select circuitry 287, e.g., a processor, etc. The switch select circuitry 287 selects one or more of switches S1 thru S8 to couple one or more corresponding ones of parametric elements P1 thru P8 of the switch circuit 216 to the RF tunnel 240 or deselects one or more switches S1 thru S8 to decouple one or more corresponding ones of parametric elements P1 thru P8 from the switches S1 thru S8 to achieve an etch rate and/or a uniformity. When the one or more of switches S1 thru S8 are coupled to or decoupled from one or more corresponding ones of parametric elements P1 thru P8, an impedance, an inductance, a capacitance, or a combination thereof, of the RF return signal 210 is controlled to achieve an etch rate of etching the substrate and/or a uniformity in etch rates of etching the substrate.

In these embodiments, the switch select circuitry 287 applies a tune recipe 289 to identify one or more of the switches S1 thru S8 to be closed, e.g., coupled, etc., or opened, e.g., decoupled, etc. The tune recipe 289 is stored within a memory device of the controller 253. The tune recipe 289 includes a correspondence between etch rates E1 thru E4 and tuning parameters T1 thru T4. For example, the etch rate E1 is mapped to the tuning parameter T1, the etch rate E2 is mapped to the tuning parameter T2, the etch rate E3 is mapped to the tuning parameter T3, and the etch rate E4 is mapped to the tuning parameter T4. The tune recipe 289 includes a correspondence between uniformities U1 thru U4 in etch rates and the tuning parameters T1 thru T4. For example, the tuning parameter T1 is mapped to the uniformity U1 in etch rates, the tuning parameter T2 is mapped to the uniformity U2 in etch rates, the tuning parameter T3 is mapped to the uniformity U3 in etch rates, and the tuning parameter T4 is mapped to the uniformity U4 in etch rates.

In some embodiments, an etch rate, or a uniformity in etch rates, or a deposition rate, or a uniformity in deposition rates is referred to herein as a measurable factor.

Examples of a tuning parameter include impedance, or an inductance (L), or a capacitance (C), or a voltage, or a current, or a complex voltage and current, or a combination thereof. Examples of a uniformity in etch rates include a curve indicating a relationship between an etch rate and a radius of the substrate. For example, each curve that plots an oxide etch rate of etching a substrate versus a radius of the substrate represents a uniformity in etching the substrate. In some embodiments, a uniformity in etch rates includes etch rates that lie within a pre-determined standard deviation of an etch rate.

It should be noted that in some embodiments, the switch circuit 216 includes any number of switches and the same number of parametric elements. Moreover, in various embodiments, the tune recipe 289 includes a correspondence between any number of etch rates and the same number of tuning parameters. In several embodiments, the tune recipe 289 includes a correspondence between any number of uniformities and the same number of tuning parameters.

In some embodiments, instead of the etch rates E1 thru E4, deposition rates D1 thru D4 are used and the deposition rates have a one-to-one correspondence with the tuning parameter T1 thru T4. For example, the deposition rate D1 corresponds to the tuning parameter T1, the deposition rate D2 corresponds to the tuning parameter T2, etc. Moreover, in these embodiments, the uniformities U1 thru U4 are uniformities in deposition rates and each uniformity has a one-to-one correspondence with a tuning parameter. For example, the uniformity U1 in deposition rates is mapped to the tuning parameter T1, the uniformity U2 in deposition rates is mapped to the tuning parameter T2, and so on. In some embodiments, each curve that plots an oxide deposition rate of depositing an oxide on a substrate versus a radius of the wafer represents a uniformity in deposition on the substrate. In some embodiments, a uniformity in deposition rates includes deposition rates that lie within a pre-determined standard deviation of a deposition rate.

Figure 4B:
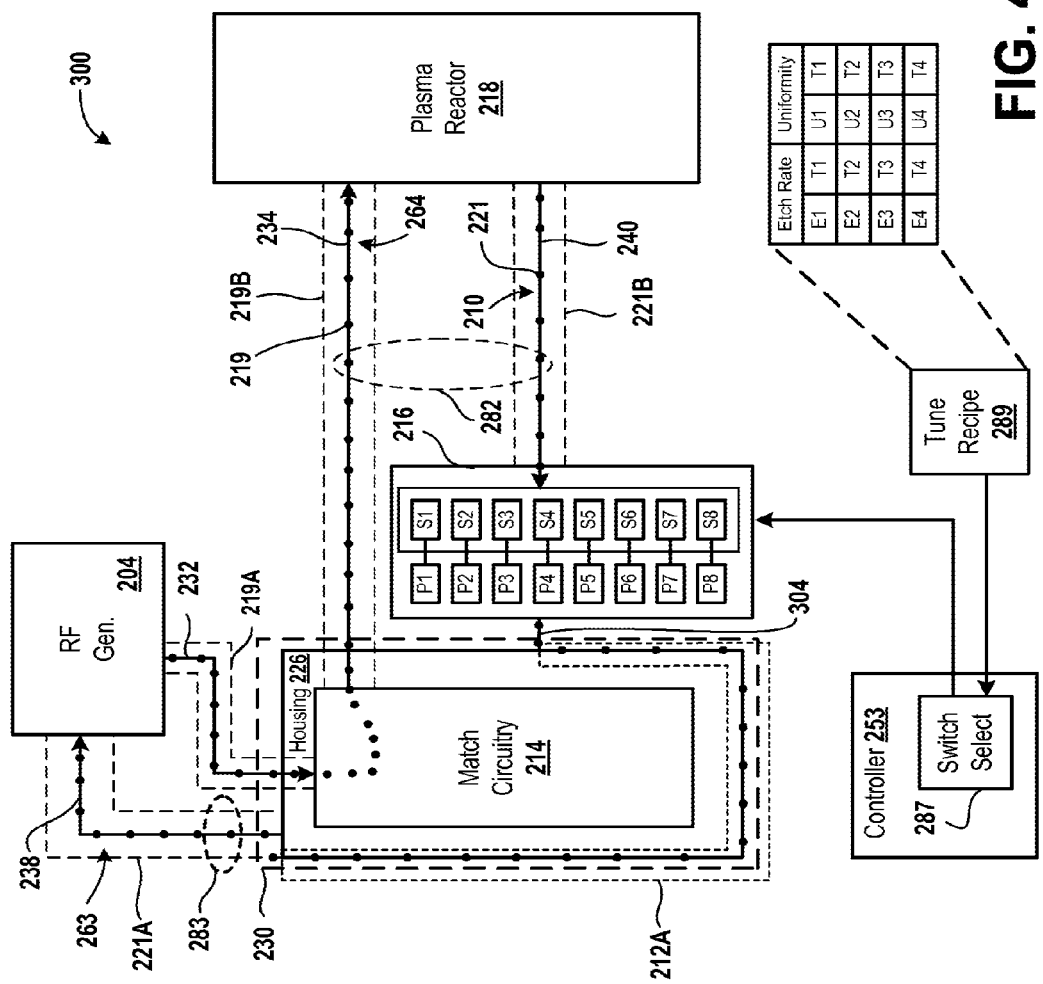
FIG. 4B is a diagram of a system for controlling an impedance of the RF return path to control non-uniformity in etch rates or deposition, in accordance with one embodiment described in the present disclosure.

FIG. 4B is a diagram of an embodiment of a system 300 for controlling an impedance of an RF return path. The system 300 includes the RF generator 204, the RF cable system 283, a matchbox 230, the RF transmission line 282, the plasma reactor 218, and the controller 253. The system 300 is similar to the system 200 except that the switch circuit 216 is located outside a housing 226 of the matchbox 230. The switch circuit 216 is coupled to the match circuitry 214 via a connection 304, e.g., an RF strap, or an RF conductor, etc., and via a wall of the housing 226. The RF cable system 283 connects the matchbox 230 to the RF generator 204.

The housing 226 surrounds and encloses the match circuitry 214 to protect the match circuitry 214. When the switch circuit 216 is located outside the housing 226, the switch circuit 216 is easily accessible. For example, when the housing 226 includes a door to access an enclosure of the housing 226, it is easy to access the switch circuit 216 that is outside the housing 226 than one inside the housing 226.

In some embodiments, the housing 226 is smaller than the housing 224 (FIG. 4A). For example, a volume of the housing 226 is less than a volume of the housing 224.

The RF return signal 210 is sent to the switch circuit 216, which modifies the RF return signal 210 to generate the RF return signal 263. The RF return signal is provided as an output from the switch circuit 216 via the connection 304 to a grounded portion of the housing 226. The RF return signal 263 is transferred via the grounded portion of the housing 226 and the RF cable sheath 238 to the RF generator 204.

In several embodiments, instead of the switches S1 thru S8 and the parametric elements P1 thru P8, the switch circuit 216 includes a variable capacitor, or a variable inductor, or the variable inductor in series with the variable capacitor. A capacitance of the variable capacitor is controlled via a motor and a driver of the motor by the switch select circuitry 287 to achieve one of the etch rates E1 thru E4 and/or to achieve one or more of the uniformities U1 thru U4. Similarly, an inductance of the variable inductor is controlled via a motor by the switch select circuitry 287 and a driver of the motor to achieve one of the etch rates E1 thru E4 and/or to achieve one or more of the uniformities U1 thru U4.

In various embodiments, at least a portion of an RF return path 212 is grounded, e.g., coupled to a ground voltage, or coupled to a reference voltage, or coupled to a zero voltage, etc. The RF return path 212 includes the first portion 221A and the second portion 221B.

In some embodiments, the RF return path 212 includes a C-shroud of the plasma chamber, a ground ring of the plasma reactor 218, RF straps of the plasma reactor 218, a bottom electrode housing of the plasma reactor 218, a ground shield of the plasma reactor 218, the second portion 221B, the switch circuit 216, the connection 304, a grounded portion 212A of the housing 226 connecting the connection 304 with the first portion 221A, and the first portion 221A. The RF return path 212 lies along dots in FIG. 4B.

In various embodiments, any number of RF straps are included within the system 200 or the system 300.

Figure 5A:
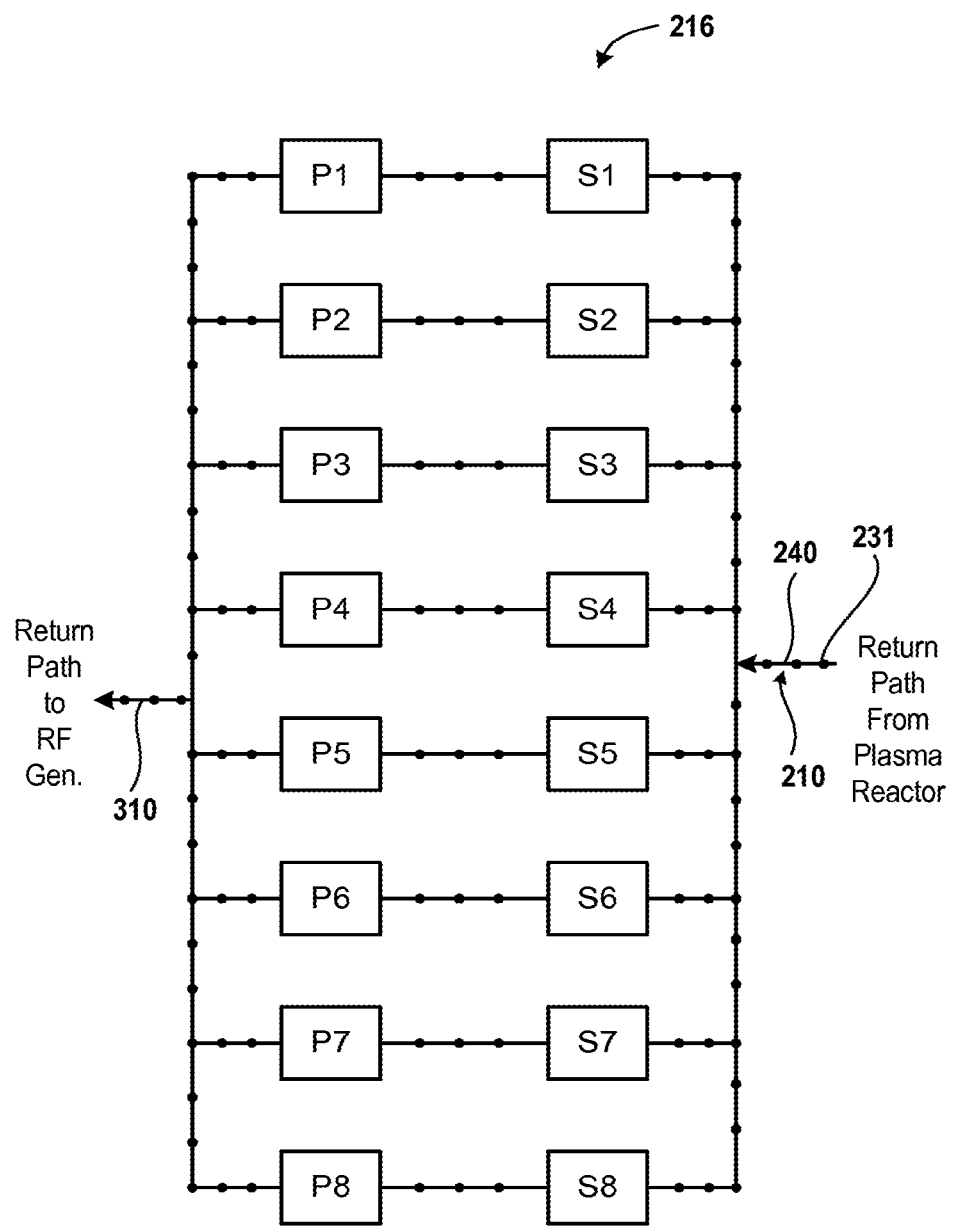
FIG. 5A is a diagram of a switch circuit that is used to control an impedance of the RF return path, in accordance with one embodiment described in the present disclosure.

FIG. 5A is a diagram of an embodiment of the switch circuit 216. The switch circuit 216 includes a series connection between a switch and a parametric element. For example, the switch circuit 216 includes a series connection between the switch S1 and the parametric element P1, a series connection between the switch S2 and the parametric element P2, a series connection between the switch S3 and the parametric element P3, a series connection between the switch S4 and the parametric element P4, a series connection between the switch S5 and the parametric element P5, a series connection between the switch S6 and the parametric element P6, a series connection between the switch S7 and the parametric element P7, and a series connection between the switch S8 and the parametric element P8.

Each combination of a switch and a parametric element of the switch circuit 216 is coupled in parallel to a combination of another switch and another parametric element of the switch circuit 216. For example, a combination of the switch S1 and the parametric element P1 is coupled in parallel to a combination of the switch S2 and the parametric element P2. As another example, a combination of the switch S2 and the parametric element P2 is coupled in parallel to a combination of the switch S3 and the parametric element P3.

The switches S1 thru S8 are coupled to the RF tunnel 240 and the parametric elements P1 thru P8 are coupled to a connection 310, which is an example of the connection 255 (FIG. 4A) or the connection 304 (FIG. 4B).

In some embodiments, each switch is a relay, e.g., a solid-state relay, or an electromagnetic relay, or a vacuum relay, etc. In various embodiments, power of the RF return signal 210 is divided equally between closed switches of the switch circuit 216.

A portion of an RF return path 231, which is an example of the RF return path 221 or 212 (FIGS. 4A, 4B), is illustrated as dots in FIG. 5A.

Figure 5B:
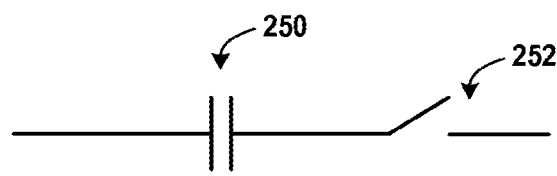
FIG. 5B is a diagram of a capacitor as a parametric element, in accordance with one embodiment described in the present disclosure.

FIG. 5B is a diagram of an embodiment of a capacitor 250 as a parametric element. The capacitor 250 is coupled in series with a switch 252. The capacitor 250 is an example of any of the parametric elements P1 thru P8 and the switch 252 is an example of any of the switches S1 thru S8.

Figure 5C:
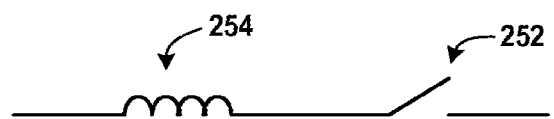
FIG. 5C is a diagram of an inductor as a parametric element, in accordance with one embodiment described in the present disclosure.

FIG. 5C is a diagram of an embodiment of an inductor 254 as a parametric element. The inductor 254 is coupled in series with the switch 252. The inductor 254 is an example of any of the parametric elements P1 thru P8. In some embodiments, each inductor 254 is an RF strap.

Figure 5D:
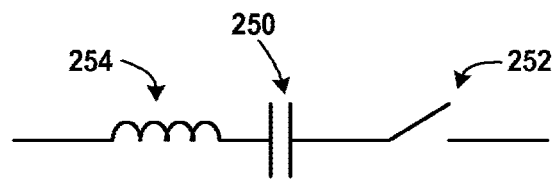
FIG. 5D is a diagram of a combination of the capacitor and the inductor as a parametric element, in accordance with one embodiment described in the present disclosure.

FIG. 5D is a diagram of an embodiment of a combination of the capacitor 250 and the inductor 254 as a parametric element. The inductor 254 is coupled in series with the capacitor 254 and the capacitor 254 is coupled in series with the switch 252.

Figure 6:
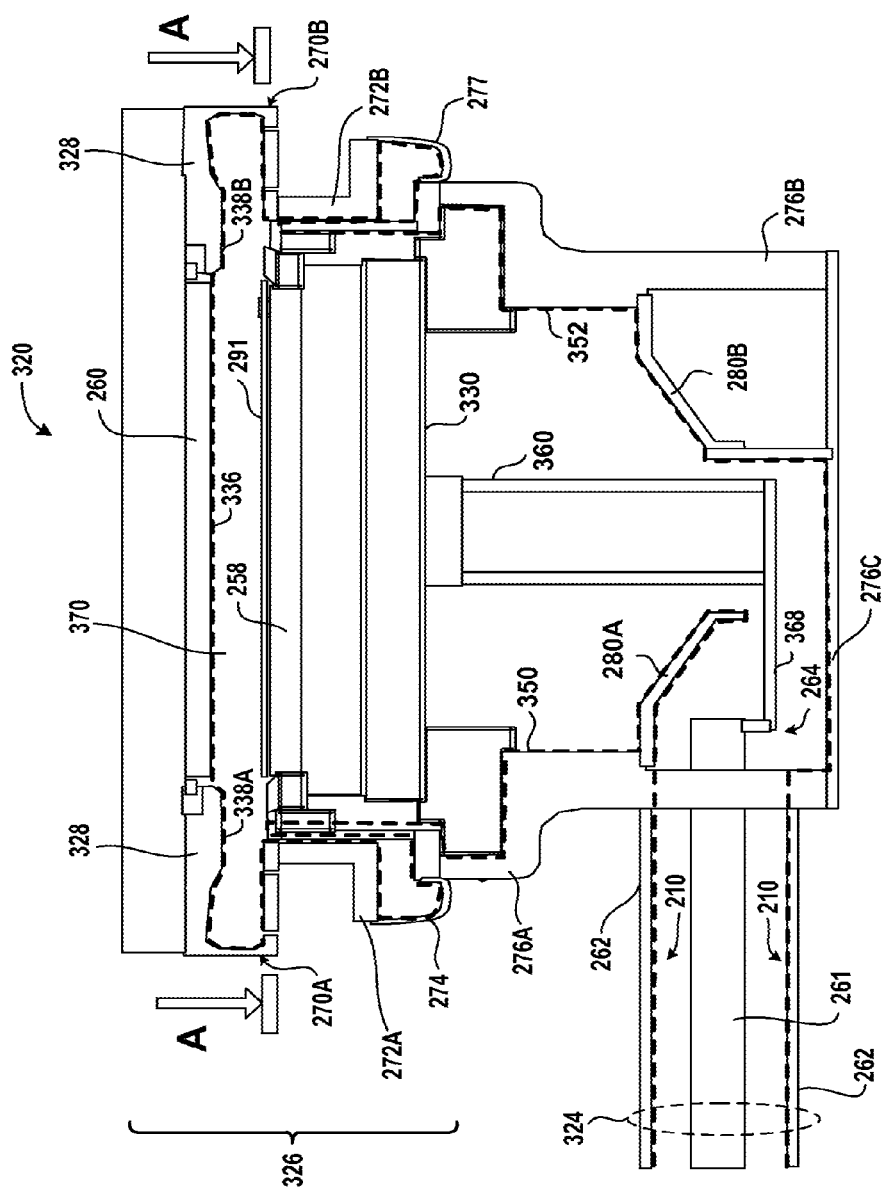
FIG. 6 is a diagram of a system for illustrating a portion of a return path of an RF signal, in accordance with one embodiment described in the present disclosure.

FIG. 6 is a diagram of an embodiment of a system for illustrating a portion of a return path of an RF signal. The system includes a plasma reactor 320 and an RF transmission line 324. The RF transmission line 324 is connected to the plasma reactor 320.

The plasma reactor 320 is an example of the plasma reactor 218 (FIGS. 4A and 4B). Moreover, the RF transmission line 324 is an example of the RF transmission line 282 (FIGS. 4A and 4B). The RF transmission line 324 includes an RF rod 261 and a grounded RF tunnel 262. As an example, the RF tunnel 262 is coupled to a ground potential or a reference potential or a zero potential. The grounded RF tunnel 262 is an example of the RF tunnel 240 (FIGS. 4A, 4B) and the RF rod 261 is an example of the RF rod 234 (FIGS. 4A, 4B).

The plasma reactor 320 includes a plasma chamber 326 and an RF cylinder 360, which is connected to the RF rod 261 via an RF strap 368. The plasma reactor 320 further includes return RF straps 274 and 277, a ground shield 280 and a bottom electrode housing 276. Examples of a C-shroud, a ground shield, and a return RF strap are provided in application Ser. No. 13/684,098, filed on Nov. 21, 2012, and having U.S. Publication No. 2013-0133834, which is incorporated by reference herein in its entirety.

The plasma chamber 326 includes an upper electrode 260, an upper electrode extension 328, a C-shroud 270, a ground ring 272, and a chuck assembly. The chuck assembly includes a chuck 258 and a facility plate 330. A substrate 291 is placed on top of the chuck 258 for processing the substrate 291. Examples of processing the substrate 291 include cleaning the substrate 291, or etching the substrate 291, or etching an oxide on top of the substrate 291, or depositing materials, e.g., oxides, dioxides, photo resist materials, etc., on the substrate 291, or a combination thereof.

The C-shroud 270 includes slots that are used to control pressure within the plasma chamber 326. For example, the slots are opened to increase gas flow through the slots to decrease gas pressure in a gap 370 of the plasma chamber 326. The plates are closed to decrease the gas flow to increase gas pressure in the gap 370.

In various embodiments, the bottom electrode housing 276 is of any shape, e.g., cylindrical, square, polygonal, etc.

In various embodiments, the RF cylinder 360 is not a cylinder and has a polygonal shape, e.g., a rectangular shape, a square shape, etc.

The upper electrode extension 328 surrounds the upper electrode 260. The C-shroud 270 includes portions 270A and 270B. The ground ring 272 includes a ground ring portion 272A and another ground ring portion 272B. The bottom electrode housing 276 includes a bottom electrode housing portion 276A, another bottom electrode housing portion 276B, and yet another bottom electrode housing portion 276C. Each bottom electrode housing portion 276A and 276B forms a side wall of the bottom electrode housing 276. The bottom electrode housing 276C forms a bottom wall of the bottom electrode housing 276. The ground shield 280 includes a ground shield portion 280A and another ground shield portion 280B.

A top surface of the chuck 258 faces a bottom surface 336 of the upper electrode 260. The plasma chamber 326 is surrounded by the upper electrode 260, the upper electrode extension 328, which surrounds the upper electrode 260. The plasma chamber 326 is further surrounded by the C-shroud 270, and the chuck 258.

The ground ring 272 is located below the C-shroud 270. In some embodiments, the ground ring 272 is located below and adjacent to the C-shroud 270. The return RF strap 274 is connected to the ground ring portion 272A and the return RF strap 277 is connected to the ground ring portion 272B. The return RF strap 274 is connected to the bottom electrode housing portion 276A and the return RF strap 277 is connected to the bottom electrode housing portion 276B. The bottom electrode housing portion 276A is connected to the ground shield portion 280A and the bottom electrode housing portion 276B is connected to the ground shield portion 280B. The ground shield portion 280A is connected via the bottom electrode housing portion 276A to the grounded RF tunnel 262 and the ground shield portion 280B is connected via the bottom electrode housing portion 276C to the grounded RF tunnel 262.

In some embodiments, the bottom electrode housing portion 276 is a cylinder that surrounds the RF cylinder 360. The RF cylinder 360 is a medium for passage of the RF supply signal 264. The RF supply signal 264 is supplied via the RF rod 261, the RF strap 368, and the RF cylinder 360 to the lower electrode of the chuck 258 to generate plasma within the gap 370 of the plasma chamber 326. The gap 370 is formed between the upper electrode 260 and the lower electrode of the chuck 258.

A portion 350 of the RF return signal 210 passes from the bottom surface 336 of the upper electrode 260 to a bottom surface portion 338A of the upper electrode extension 328, further to the C-shroud portion 270A, further to the ground ring portion 272A, further to the return RF strap 274, further to the bottom electrode housing portion 276A, further to the ground shield portion 280A, to the grounded RF tunnel 262.

In some embodiments, the portion 350 of the RF return signal 210 passes from the bottom surface 336 of the upper electrode 260, further along the bottom surface portion 338A of the upper electrode extension 328, further along the C-shroud portion 270A, further along the ground ring portion 272A, further along the return RF strap 274, further along the bottom electrode housing portion 276A, further along the ground shield portion 280A, to the grounded RF tunnel 262.

In some embodiments, the portion 350 of the RF return signal 210 follows a portion of the RF return path 221 (FIG. 4A) or a portion of the RF return path 212 (FIG. 4B).

Moreover, a portion 352 of the RF return signal 210 passes from the bottom surface 336 to a bottom surface portion 338B of the upper electrode extension 328, further to the C-shroud portion 270B, further to the ground ring portion 272B, further to the return RF strap 277, further to the bottom electrode housing portion 276B, further to the ground shield portion 280B, further to a portion of the bottom electrode housing portion 276C, further to the bottom electrode housing portion 276B, to the grounded RF tunnel 262.

In various embodiments, the portion 352 of the RF return signal 210 passes from the bottom surface 336, along the bottom surface portion 338B of the upper electrode extension 328, further along the C-shroud portion 270B, further along the ground ring portion 272B, further along the return RF strap 277, further along the bottom electrode housing portion 276B, further along the ground shield portion 280B, further along the bottom electrode housing portion 276C, further along the bottom electrode housing portion 276B, to the grounded RF tunnel 262.

In some embodiments, the portion 352 of the RF return signal 210 follows a portion of the RF return path 221 (FIG. 4A) or a portion of the RF return path 212 (FIG. 4B).

It should be noted that a portion of the RF return path 221 or 212 (FIGS. 4A, 4B) of the RF return signal 210 extends from the bottom surface 336 of the upper electrode 260, along the bottom surface portion 338A of the upper electrode extension 328, further along the C-shroud portion 270A, further along the ground ring portion 272A, further along the return RF strap 274, further along the bottom electrode housing portion 276A, further along the ground shield portion 280A, to the grounded RF tunnel 262.

Moreover, a portion of the RF return path 221 or 212 (FIGS. 4A, 4B) of the RF return signal 210 extends from the bottom surface 336 of the upper electrode 260, along the bottom surface portion 338B of the upper electrode extension 328, further along the C-shroud portion 270B, further along the ground ring portion 272B, further to the return RF strap 277, further along the bottom electrode housing portion 276B, further along the ground shield portion 280B, further along the bottom electrode housing portion 276C, to the grounded RF tunnel 262. A path taken by the RF return signal 210 is shown in dashed lines in FIG. 6.

In some embodiments, the upper electrode 260 is grounded.

In various embodiments, instead of the RF strap 368, a number of RF straps are used to connect the RF cylinder 360 to the RF rod 261.

Figure 7:
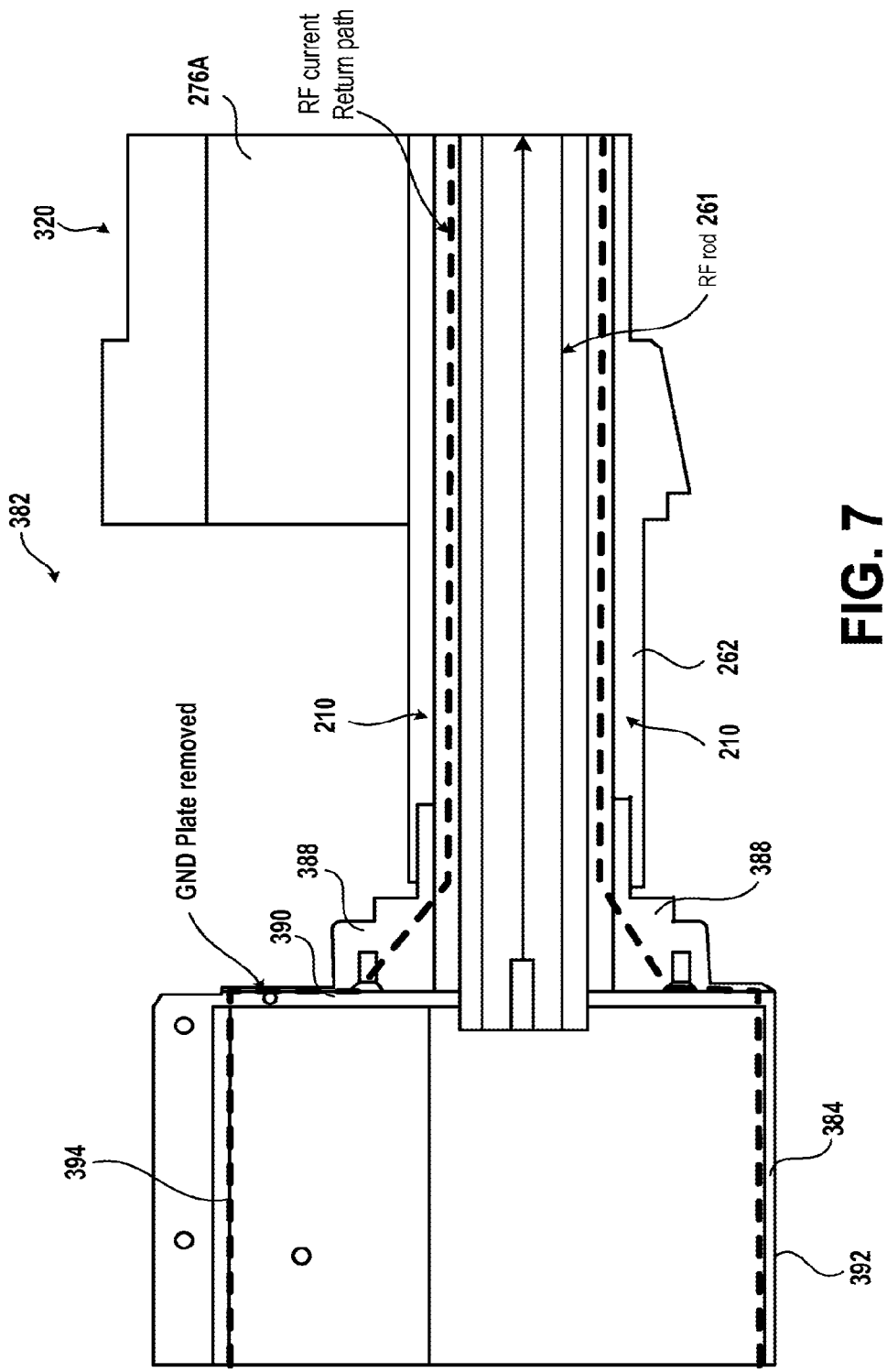
FIG. 7 is a diagram of a system that illustrates a portion of an RF return path of an RF return signal, in accordance with one embodiment described in the present disclosure.

FIG. 7 is a diagram of an embodiment of a system 382 that illustrates a portion of an RF return path of the RF return signal 210. The RF rod 261 extends through the bottom electrode housing portion 276A. Moreover, the RF rod 261 is connected to a housing 384 of a matchbox via an RF tunnel extension 388. The RF tunnel extension 388 is a part of the RF tunnel 262 and is attached, e.g., screwed, etc. to a side wall 390 of the housing 384. In some embodiments, a ground plate that is attached to the side wall 390 is removed to attach the RF tunnel extension 388 to the side wall 390. The housing 384 is an example of the housing 224 (FIG. 4A) or of the housing 226 (FIG. 4B).

The RF return signal 210 is transferred via a portion of the RF tunnel 262, the RF tunnel extension 388, and the side wall 390 to a bottom wall 392 of the housing 384. Moreover, the RF return signal 210 is transferred via a portion of the RF tunnel 262, the RF tunnel extension 388, and the side wall 390 to a top wall 394 of the housing 384. A path taken by the RF return signal 210 is shown in dashed lines in FIG. 7.

Figure 8:
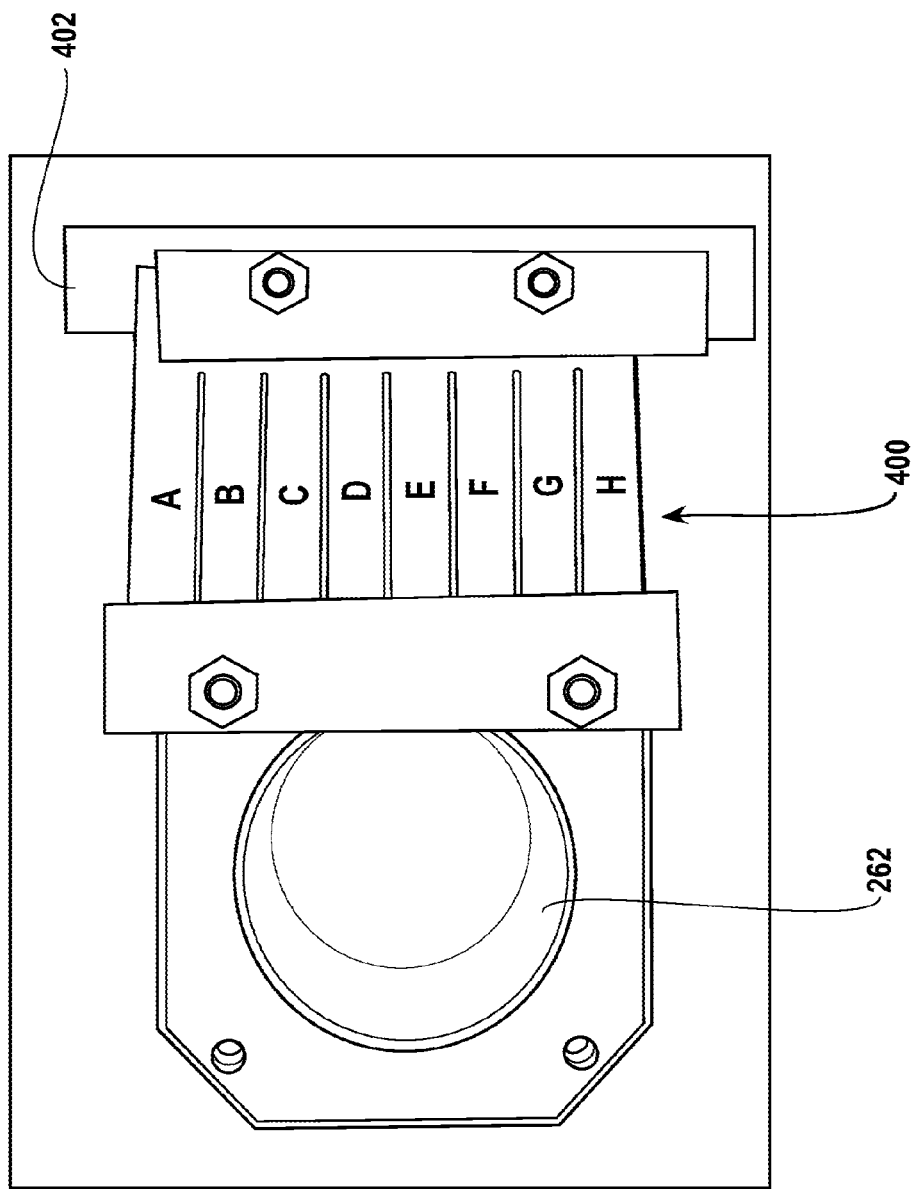
FIG. 8 is a diagram of an inductor system that is connected between a matchbox housing and an RF tunnel to modify an impedance of an RF return signal, in accordance with one embodiment described in the present disclosure.

FIG. 8 is a diagram of an embodiment of an inductor system 400 that is connected between a matchbox housing and an RF tunnel to modify an impedance of an RF return signal. The inductor system 400 includes one or more inductor straps A thru H, e.g., straps made of a conductive metal, straps made of copper, straps made of aluminum, etc.

The straps A thru H couple the RF tunnel 262 to a housing 402 of a matchbox. The housing 402 is an example of the housing 384 (FIG. 7) and is grounded, e.g., connected to a ground potential, or connected to a reference potential, or connected to a zero potential, etc.

As a number of the straps A thru H between the RF tunnel 262 and the housing 402 is changed, e.g., removed, or added, a combination thereof, etc., there is a change in an impedance of an RF return signal, e.g., the RF return signal 263 (FIGS. 4A, 4B), etc., that is returned as an output from the housing 402 to the RF cable sheath 238 (FIGS. 4A, 4B) that is connected to the housing 402.

It should be noted that in some embodiments, the inductor system 400 includes any number of straps.

Figure 9:
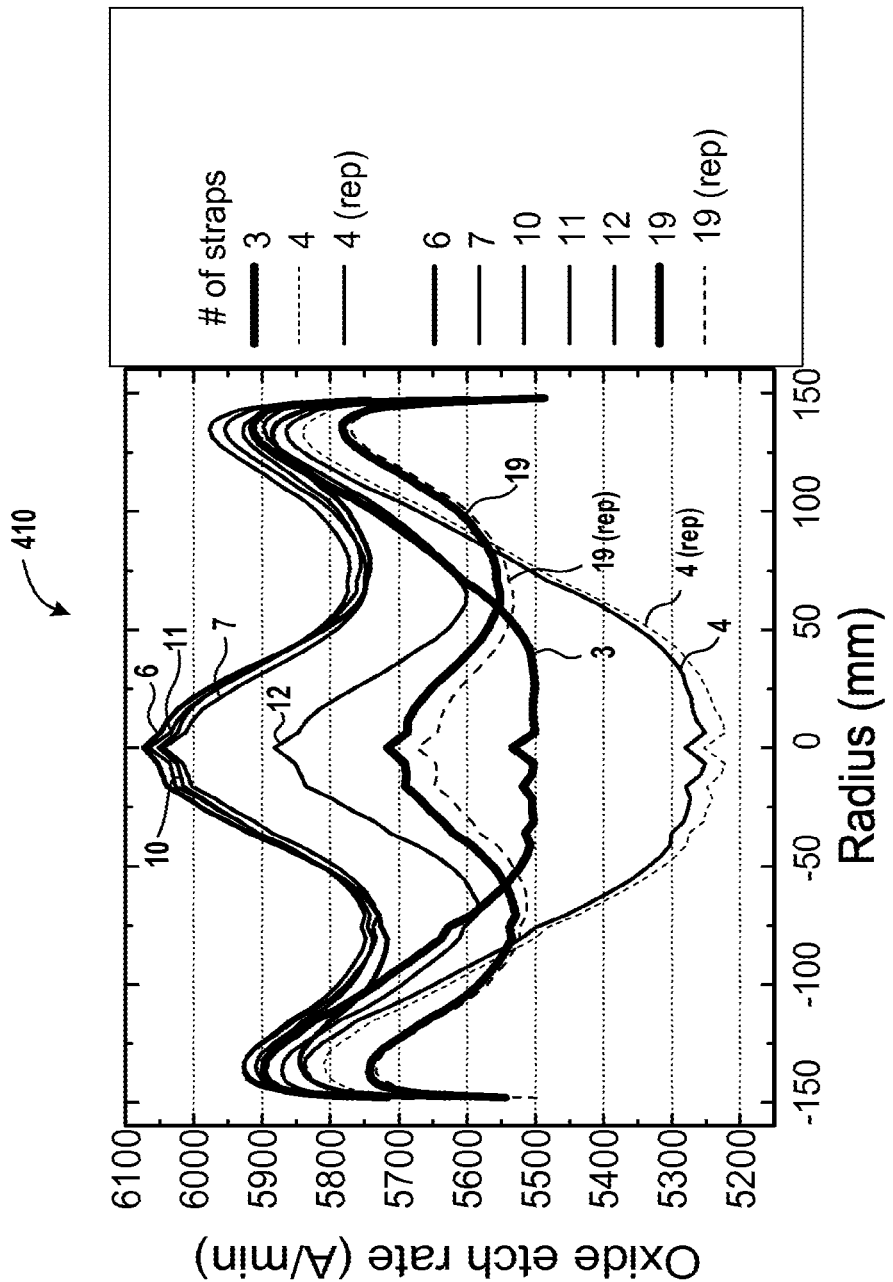
FIG. 9 is a graph that plots an etch rate of etching a substrate with respect to a radius of the substrate for different numbers of inductor straps, in accordance with one embodiment described in the present disclosure.

FIG. 9 is an embodiment of a graph 410 that plots an etch rate of etching a substrate with respect to a radius of the substrate for a different number of inductor straps. As a number of inductor straps is increased from three to 6, there is an increase in non-uniformity in the etch rates. Moreover, as a number of inductor straps is increased from 10 thru 19, there is a decrease in the non-uniformity in the etch rates. It should be noted that when a number of inductor straps is three, there is uniformity in the etch rates close to a center, e.g., close to a zero radius, within a pre-determined distance from a center of the substrate, etc., of a substrate. By controlling a number of inductor straps, a control, e.g., reduction, etc., in non-uniformity in the etch rates is achieved.

In some embodiments, a non-uniformity in an etch rates is measured close to the center of the substrate.

Figure 10:
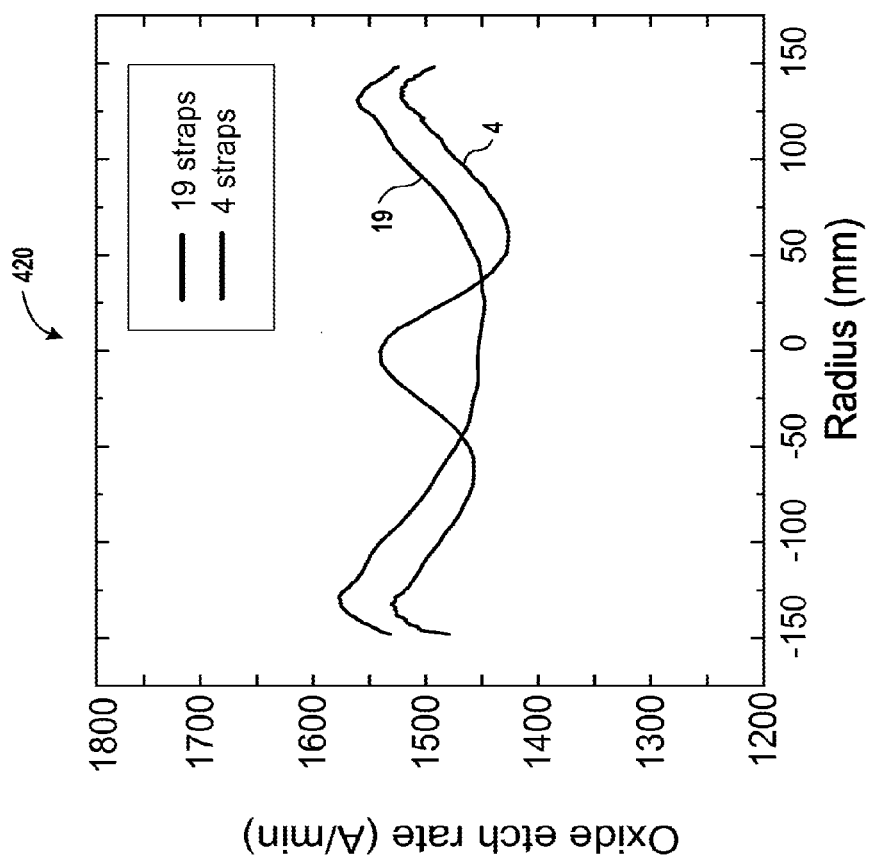
FIG. 10 is a graph that shows a relationship between an etch rate of etching a substrate and a radius of the substrate for two different numbers of inductor straps, in accordance with one embodiment described in the present disclosure.

FIG. 10 is an embodiment of a graph 420 that shows a relationship between an etch rate of etching a substrate and a radius of the substrate for two different number of inductor straps. As shown in graph 420, as a number of inductor straps increases, there is a decrease in non-uniformity in the etch rates.

Figure 11:
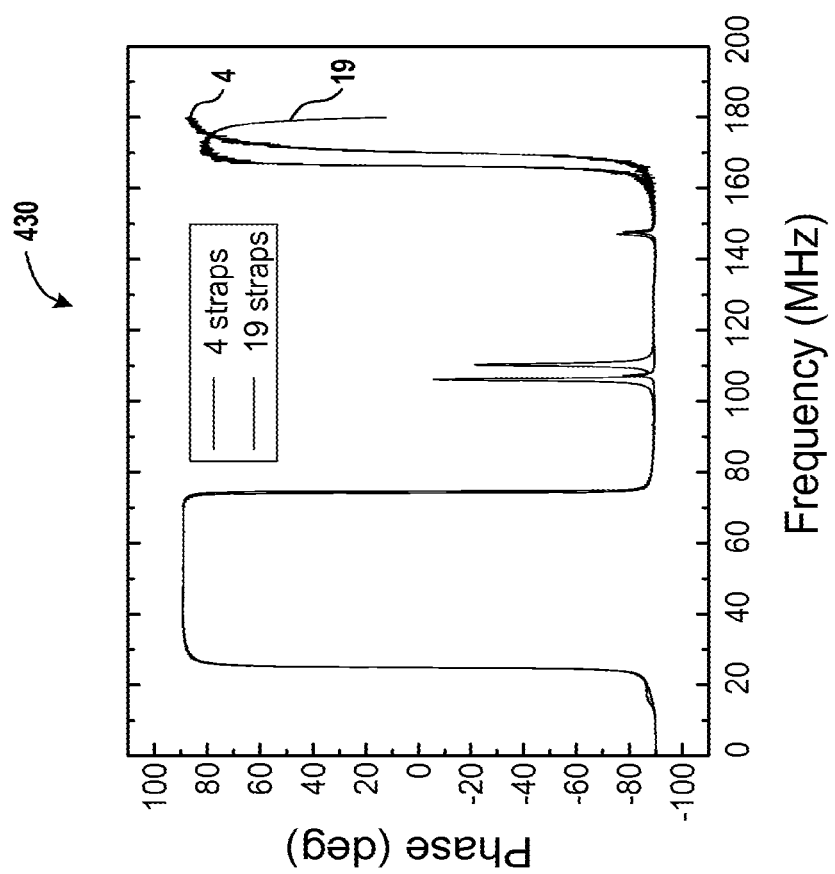
FIG. 11 is a graph that plots a phase of an RF return signal versus a frequency of the RF return signal for different numbers of inductor straps, in accordance with one embodiment described in the present disclosure.

FIG. 11 is an embodiment of a graph 430 that plots a phase of an RF return signal versus a frequency of the RF return signal for different numbers of inductor straps. As shown in the graph 430, at a third harmonic of an RF return signal, a phase of an RF return signal decreases when nineteen inductor straps are used compared to a phase of the an RF return signal when four inductor straps are used. The reduction in phase helps control, e.g., achieve, etc., uniformity in etch rates of etching a substrate or in deposition rates of depositing materials on the substrate.

It should be noted that in some embodiments, a non-uniformity in etch rates or in deposition rates is controlled by controlling a gap between an upper electrode and a lower electrode of a plasma chamber in addition to using the switch circuit. For example, a processor, e.g., the switch select circuitry 287 (FIGS. 4A, 4B), etc., is connected via a motor driver to a motor that is connected to the upper electrode and/or to the lower electrode. The processor sends a signal to the motor driver to rotate a rotor of the motor. The rotation of the rotor results in a change in distance between the upper and lower electrodes to control the gap, which includes a distance between the upper and lower electrodes. The change in gap is used to reduce the non-uniformity. In several embodiments, a gap between the upper and lower electrodes includes a space volume between the upper and lower electrodes. In various embodiments, the processor controls the motor via the motor driver to control the gap simultaneously with controlling the switch circuit 216 (FIGS. 4A, 4B) by sending a signal to the switch circuit 216 to reduce the non-uniformity.

In various embodiments, a non-uniformity in etch rates or deposition rates is reduced by controlling an amount of pressure within a plasma chamber and by using the switch circuit. For example, a processor, e.g., the switch select circuitry 287 (FIGS. 4A, 4B), etc., is connected to a motor that is connected to a valve. The valve is connected via a tubing to a gas supply, which stores one or more gases. The processor sends a signal to a motor driver to operate a rotor of the motor to open or close the valve. The valve is opened and closed to control, e.g., increase, or decrease, etc., an amount of flow of the one or more gases into the gap, within the plasma chamber, between upper and lower electrodes. An increase in the amount of flow increases pressure in the chamber and a decrease in the amount of flow decreases the pressure. The pressure is used to reduce the non-uniformity in addition to using the switch circuit 216 (FIGS. 4A, 4B). In some embodiments, the processor controls the pressure in the gap simultaneously with controlling the switch circuit 216 to reduce the non-uniformity.

Figure 12:
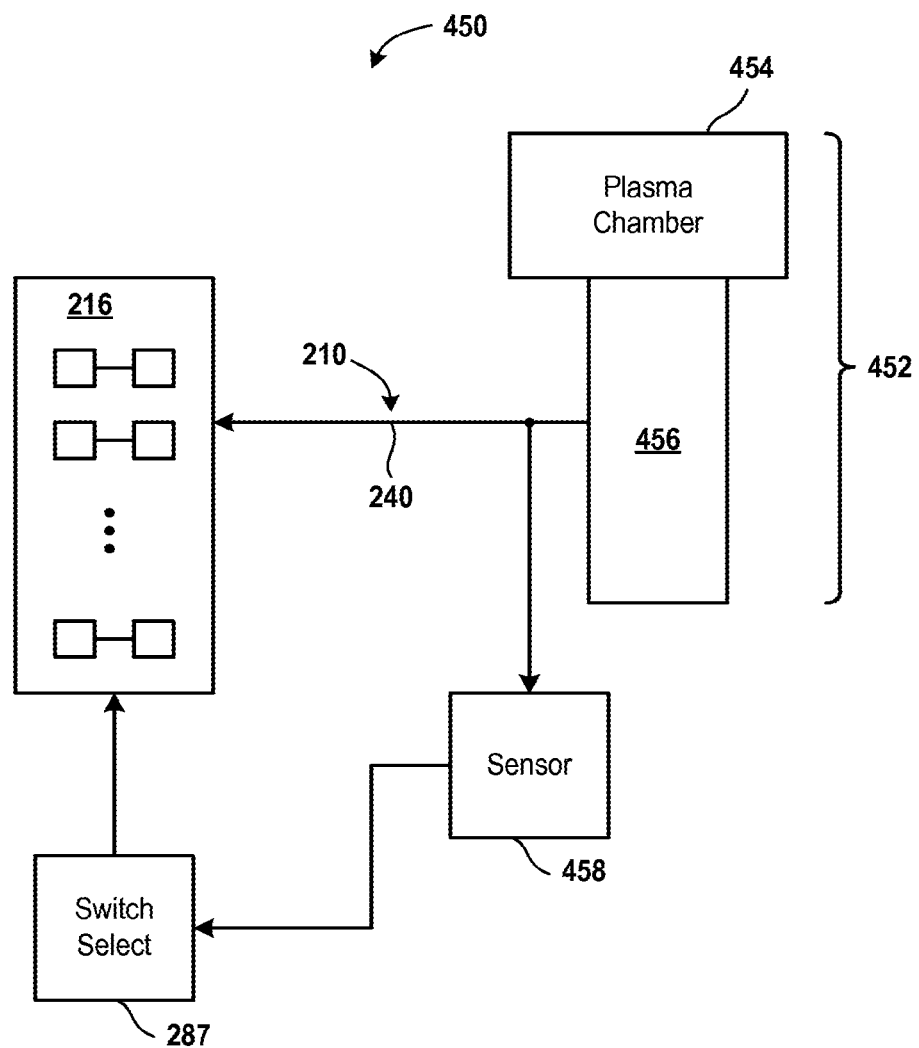
FIG. 12 is a diagram of an embodiment of a system used to illustrate feedback control to achieve an etch rate, or a deposition rate, or a uniformity in etch rates, or a uniformity in deposition rates, in accordance with one embodiment described in the present disclosure.

FIG. 12 is a diagram of an embodiment of a system 450 for using a feedback loop for controlling uniformity in etch rates, or uniformity in deposition rates, or achieving an etch rate, or achieving a deposition rate. The system 450 includes a plasma reactor 452, which is an example of the plasma reactor 218 (FIGS. 4A, 4B). The plasma reactor 452 includes a plasma chamber 454, which is an example of the plasma chamber 326 (FIG. 6). The plasma reactor 452 further includes a bottom electrode housing 456, which is an example of the bottom electrode housing 276 (FIG. 6).

The bottom electrode housing 456 is connected to the RF tunnel 240. A sensor 458, e.g., a voltage and current probe, a voltage probe, etc., is coupled to the RF tunnel 240. The sensor 458 measures a parameter, e.g., voltage or a complex voltage and current, etc., of the RF return signal 210.

In some embodiments, the sensor 458 is connected to any point along the RF return path 212 or 221 (FIGS. 4A, 4B). For example, the sensor 458 is connected to any point on the RF tunnel 240.

In some embodiments, the sensor 458 is connected to any point along the RF delivery path 219 (FIGS. 4A, 4B). For example, the sensor 458 is connected to any point on the RF rod 234.

The sensor 458 provides the measured parameter to the switch select circuitry 287. The switch select circuitry 287 determines whether the measured parameter is similar to, e.g., is equal to or is within a pre-determined range of, etc., a tuning parameter within the tune recipe 289 (FIGS. 4A, 4B). The tuning parameter corresponds to a uniformity in etch rates or uniformity in deposition rates or a deposition rate or an etch rate. Upon determining that the measured parameter is not similar to the tuning parameter, the switch select circuitry 287 sends a signal to the switch circuit 216 to open or close one or more of the switches S1 thru S8 to disconnect or connect corresponding one or more of the parametric elements P1 thru P8 to a grounded matchbox housing, e.g., the housing 224 or the housing 226 (FIGS. 4A, 4B). The signal is sent to achieve the tuning parameter that was used to determine whether the measured parameter is similar to the tuning parameter. On the other hand, upon determining that the measured parameter is similar to the tuning parameter, the switch select circuitry 287 does not send a signal that allows to open or close one or more of the switches S1 thru S8 to the switch circuit 216.

It is noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron-cyclotron resonance (ECR) reactor, etc. For example, the x MHz RF generator, the y MHz RF generator, and/or the z MHz RF generator are coupled to an inductor within the ICP plasma chamber.

It is also noted that although some of the operations above are described as being performed by the switch select circuitry 287 (FIGS. 4A, 4B), in some embodiments, the operations are performed by one or more digital signal processors of one or more of the x, y, and z MHz RF generators.

It should be noted that in some of the above-described embodiments, an RF supply signal is provided to the lower electrode of the chuck and an upper electrode is grounded. In various embodiments, an RF supply signal is provided to the upper electrode and the lower electrode of a chuck is grounded.

In some embodiments, the operations described herein are practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relate to a hardware unit or an apparatus for performing these operations. In various embodiments, the apparatus is specially constructed for a special purpose computer. When defined as a special purpose computer, the computer can also perform other processing, program execution or routines that are not part of the special purpose, while still being capable of operating for the special purpose. In some embodiments, the operations are processed by a general purpose computer selectively activated or configured by one or more computer programs stored in the computer memory, cache, or obtained over a network. When data is obtained over a network, the data is processed by other computers on the network, e.g., a cloud of computing resources.

One or more embodiments can also be fabricated as computer-readable code on a non-transitory computer-readable medium. The non-transitory computer-readable medium is any memory device that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. The non-transitory computer-readable medium can include computer-readable tangible medium distributed over a network-coupled computer system so that the computer-readable code is stored and executed in a distributed fashion.

Although some method operations above were described in a specific order in some of the embodiments, it should be understood that in various embodiments, other housekeeping operations are performed in between operations, or operations are adjusted so that they occur at slightly different times, or are distributed in a system which allows the occurrence of the processing operations at various intervals associated with the processing, as long as the processing of the overlay operations are performed in the desired way.

In some embodiments, one or more features from any embodiment are combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A matchbox comprising:
a housing;
a match circuitry located within the housing;
a switch circuit located within the housing, the switch circuit including:
a plurality of switches; and
a plurality of parametric elements spaced apart from each other, wherein each of the parametric elements is connected to a corresponding one of the switches, wherein each of the switches is configured to be connected to a return path of a radio frequency (RF) transmission line to modify an impedance of the return path.

2. The matchbox of claim 1, wherein the match circuitry includes a plurality of circuit elements to match an impedance of a load coupled to the match circuit with that of a source coupled to the match circuitry.

3. The matchbox of claim 1, wherein one of the switches is connected to one of the parametric elements, and another one of the switches is connected to another one of the parametric elements, wherein each of the parametric elements is a metal strap.

4. The matchbox of claim 1, wherein the return path includes an RF tunnel that surrounds an RF rod of the RF transmission line.

5. The matchbox of claim 1, wherein the return path includes a portion of the housing and an RF sheath of an RF cable that couples the match circuitry to an RF generator.

6. The matchbox of claim 1, wherein each of the parametric elements is a capacitor or an inductor.

7. The matchbox of claim 1, wherein the match circuitry is coupled to an RF rod of the RF transmission line.

8. A system comprising:
a housing;
a match circuitry located within the housing;
a switch circuit located outside the housing, the switch circuit including:
a plurality of switches; and
a plurality of parametric elements spaced apart from each other, wherein each of the parametric elements is connected to a corresponding one of the switches, wherein each of the switches is connected to a return path of a radio frequency (RF) transmission line to modify an impedance of the RF return path.

9. The system of claim 8, wherein the match circuitry includes a plurality of circuit elements to match an impedance of a load coupled to the match circuitry with that of a source coupled to the match circuitry.

10. The system of claim 8, wherein one of the switches is connected to one of the parametric elements, and another one of the switches is connected to another one of the parametric elements, wherein each of the parametric elements is a metal strap.

11. The system of claim 8, wherein the return path includes an RF tunnel that surrounds an RF rod of the RF transmission line.

12. The system of claim 8, wherein the return path includes a portion of the housing and an RF sheath of an RF cable that couples the match circuitry to an RF generator.

13. The system of claim 8, wherein each of the parametric elements is a capacitor or an inductor.

14. The system of claim 1, wherein the match circuitry is coupled to an RF rod of the RF transmission line.

15. A system comprising:
a controller;
a switch circuit coupled to the controller, the switch circuit including:
a plurality of switches; and
a plurality of parametric elements spaced apart from each other, wherein each of the parametric elements is connected to a corresponding one of the switches, wherein the switches are connected to a return path of a radio frequency (RF) transmission line, wherein the controller is configured to control the switches to modify an impedance of the return path.

16. The system of claim 15, wherein the switch circuit is coupled to a housing of a match circuitry, wherein the match circuitry is configured to match an impedance of a load connected to the match circuitry with the source connected to the match circuitry.

17. The system of claim 15, wherein one of the switches is connected to one of the parametric elements, and another one of the switches is connected to another one of the parametric elements, wherein each of the parametric elements is a metal strap.

18. The system of claim 15, wherein the return path includes an RF tunnel that surrounds an RF rod of the RF transmission line.

19. The system of claim 15, wherein the return path includes a portion of a housing of a match circuitry and an RF sheath of an RF cable that couples the match circuitry to an RF generator, wherein the match circuitry is coupled to an RF rod of the RF transmission line.

20. The system of claim 15, wherein each of the parametric elements is a capacitor or an inductor.

* * * * *